United States Patent [19]

Sakai et al.

[11] Patent Number: 5,075,244
[45] Date of Patent: Dec. 24, 1991

[54] METHOD OF MANUFACTURING IMAGE SENSORS

[75] Inventors: Yoshihiko Sakai; Takehito Hikichi, both of Kanagawa, Japan

[73] Assignee: Fuji Xerox Co., Ltd., Tokyo, Japan

[21] Appl. No.: 578,604

[22] Filed: Sep. 7, 1990

[30] Foreign Application Priority Data

Nov. 16, 1989 [JP] Japan ................. 1-296254

[51] Int. Cl.$^5$ ............................ H01L 27/14
[52] U.S. Cl. ....................... 437/41; 437/50; 437/51; 437/101; 357/30; 357/23.7; 357/2; 357/4
[58] Field of Search ........ 437/40, 41, 43, 47, 437/48, 50, 51, 2, 101, 192, 194, 181; 357/30 H, 30 K, 30 L, 23.7, 2, 4; 250/211 R, 211 J, 208.1, 578.1; 350/333, 339 R, 334, 335, 336, 342

[56] References Cited

U.S. PATENT DOCUMENTS

| | | | |
|---|---|---|---|
| 4,040,073 | 8/1977 | Luo | 437/160 |
| 4,389,481 | 6/1983 | Poleshuk et al. | 437/71 |
| 4,601,097 | 7/1986 | Shimbo | 357/30 L |
| 4,724,470 | 2/1988 | Van Santen et al. | 357/30 H |
| 4,727,407 | 2/1988 | Nobue et al. | 357/30 L |
| 4,736,229 | 4/1988 | Holmberg et al. | 357/30 K |
| 4,759,610 | 7/1988 | Yanagisawa | 357/30 L |
| 4,764,682 | 8/1988 | Swartz | 357/30 H |
| 4,778,560 | 10/1988 | Takeda et al. | 357/23.7 |
| 4,791,466 | 12/1988 | Kato | 357/30 H |
| 4,792,670 | 12/1988 | Fukaya et al. | 250/211 R |
| 4,823,178 | 4/1989 | Suda | 357/2 |
| 4,860,076 | 8/1989 | Tabei et al. | 357/30 K |
| 4,862,234 | 8/1989 | Koden | 357/4 |
| 4,862,237 | 8/1989 | Morozumi | 357/23.7 |
| 4,885,616 | 12/1989 | Ohta | 357/23.7 |
| 4,889,983 | 12/1989 | Numano et al. | 250/208.1 |
| 4,894,700 | 1/1990 | Nobue et al. | 357/30 L |
| 4,904,056 | 2/1990 | Castleberry | 350/339 R |
| 4,916,304 | 4/1990 | Habashi et al. | 250/578.1 |
| 4,931,661 | 6/1990 | Fukaya et al. | 250/211 R |
| 4,935,792 | 6/1990 | Tanaka et al. | 357/23.7 |
| 4,958,205 | 9/1990 | Takeda et al. | 357/30 H |
| 4,988,631 | 1/1991 | Ogawa et al. | 357/30 K |

FOREIGN PATENT DOCUMENTS

| | | | |
|---|---|---|---|
| 0082466 | 4/1986 | Japan | 357/30 K |
| 63-9358 | 1/1988 | Japan | |
| 63-67772 | 3/1988 | Japan | |
| 0091467 | 4/1989 | Japan | 357/23.7 |
| 0296671 | 11/1989 | Japan | 357/23.7 |

OTHER PUBLICATIONS

Handbook of Chemistry and Physics, 67th edition, 1986-1987.

Primary Examiner—Robert Kunemund
Assistant Examiner—M. Wilczewski
Attorney, Agent, or Firm—Finnegan, Henderson, Farabow, Garrett and Dunner

[57] ABSTRACT

An image sensor manufacturing method, in which a chromium layer or the tantalum layer as barrier metal is formed on the semiconductor layer as the ohmic contact layer of the thin film transistor switching element (TFT). With use of the chromium layer or the tantalum layer, the semiconductor layers of an n+ hydrogenated amorphous silicon (n+a−Si:H) can be protected when metal, e.g., aluminum, is vapor deposited or deposited by the sputtering method. Accordingly, the characteristic of the semiconductor layers can be kept intact, and consequently the reliability of the image sensor is improved. Further, when the chromium layer or the tantalum layer as barrier metal is formed, the lower electrode portion of the photo detect element is formed using the same layer, in the same photolithograph process. Accordingly, the manufacturing of image sensors is simpler than that of the same in which the photo detect elements and the TFTs are formed in different process steps.

4 Claims, 5 Drawing Sheets

METHOD OF MANUFACTURING IMAGE SENSORS

BACKGROUND OF THE INVENTION

The present invention relates to a method of manufacturing an image sensor used for facsimiles, scanners, and the like, and more particularly to a method of readily manufacturing a reliable image sensor with thin film transistor switching elements.

In conventional image sensors, particularly a contact type image sensor, image information of a document, for example, are projected onto the sensor in one-to-one correspondence, and then the sensor converts the image information into electrical signals. In the conventional image sensor, a TFT drive image sensor is arranged such that the projected image information are divided into a number of picture elements (photo detect elements), charges generated by the photo detect elements are temporarily stored in load capacitors by using thin film transistor switching elements (TFTs), and then are time sequentially read out of the load capacitors in the form of electrical signals at a speed within a range between several hundreds kHz and several MHz. In the TFT drive image sensor, image data can be read out by a single drive IC, through the operations of the TFTs. Accordingly, the number of drive ICs for driving the image sensor may be reduced.

Figure 6:
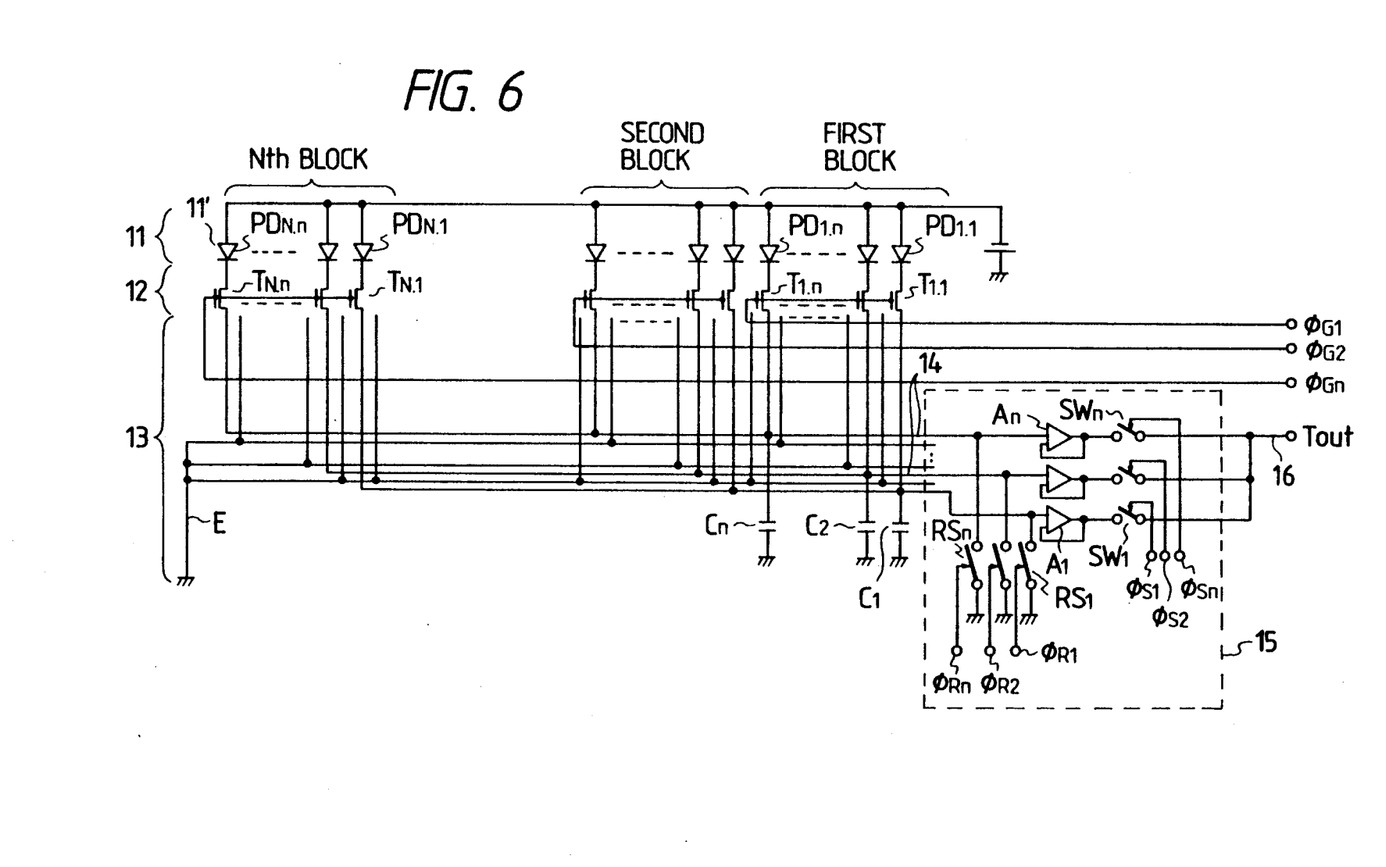
FIG. 6 is an equivalent circuit showing a conventional image sensor.

An equivalent circuit of the TFT drive image sensor is as shown in FIG. 6. As shown, it comprises a linear array 11 consisting of photo detect elements and having the length substantially equal to the width of a document, a charge transfer section 12 including a plurality of thin film transistors $T_{N,n}$, which are provided in association with the photo detect elements 11' in one-to-one correspondence, and a multi-layer wiring section 13.

The photo detect element array 11 consists of N number of blocks of photo detect elements. One block consists of "n" photo detect elements and may be equivalently expressed by a photo diode $PD_{N,n}$. The photo detect elements 11' are connected to the drain electrodes of the thin film transistors $T_{N,n}$. The source electrodes of the transistors $T_{N,n}$ are connected, for each block, through the multi-layer wiring section 13 in a matrix fashion, to common signal lines 14 ("n" number of lines) and load capacitors $C_n$. The gate electrodes of the transistors $T_{N,n}$ are coupled with a gate pulse generator (not shown), so that those are made conductive for each block. Charges generated by each photo detect element 11' are stored in a parasitic capacitance of the photo detect element and an overlap capacitor between the drain and gate of the thin film transistor for a predetermined period of time, and are sequentially transferred for each block to the load capacitor $C_n$ by using the thin film transistor $T_{N,n}$ as a transfer switch. To be more specific, in response to a gate pulse $\phi G1$ from the gate pulse generator, the thin film transistors $T_{1,1}$ to $T_{1,n}$ of the first block are turned on, the charges as generated and stored by the photo detect elements 11' of the first block are transferred to the load capacitors $C_n$ and stored therein. Potentials of the common signal lines 14 vary depending on the charges stored in the load capacitors $C_n$. The voltage values are time sequentially picked up onto an output line 16 by sequentially turning on analog switches $SW_1$ to $SW_n$ within a drive IC 15. In response to gate pulses $\phi G2$ to $\phi Gn$, the thin film transistors $T_{2,1}$ to $T_{2,n}$ to $T_{N,1}$ to $T_{N,n}$ of the second to N-th blocks are sequentially turned on, so that charges from the photo detect elements are transferred for each block. In this way, by sequentially reading the charges, image signals of one line in the main scan direction are obtained. A document is moved by an original feed means, such as a roller (not shown). A sequence of the operations is repeated, and finally image signals of the whole original are obtained (see Japanese Patent Unexamined Publication Nos. 63-9358 and 63-6772).

Figure 7:
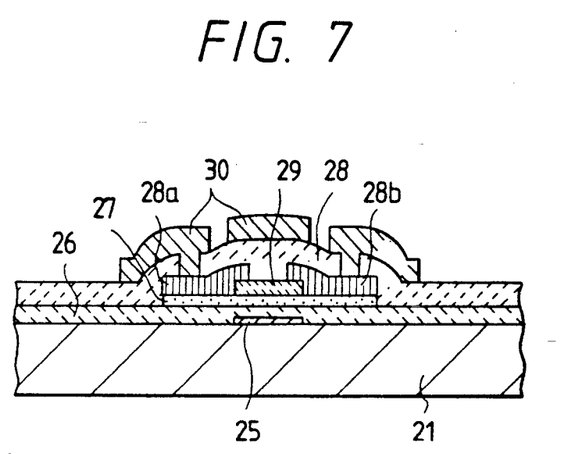
FIG. 7 is a sectional view showing a conventional charge transfer section.

A specific structure of the conventional thin film transistor switching element (TFT) is as shown in FIG. 7. As seen, the structure of it is of the inverse stagger type. As shown, a chromium layer as a gate electrode 25, silicon nitride film as a gate insulating layer 26, hydrogenated amorphous silicon (a-Si:H) layer as a semiconductor active layer 27, silicon nitride film as a top insulating layer 29 disposed facing the gate electrode 25, and an n' hydrogenated amorphous silicon (n+a-Si:H) layer as an ohmic contact layer 28 are layered on a substrate 21 successively from bottom to top. The ohmic contact layer 28 is divided into a part 28a of a drain electrode and a part 28b of a source electrode. An aluminum layer 30 as a wire is formed over the structure thus arranged. The drain electrode and the source electrode are an n+ hydrogenated amorphous silicon (n+a - Si : H) layer and an aluminum layer, respectively. A wire led from an individual electrode of the photo detect element is connected to the part 28a of the drain electrode.

A method of manufacturing the thin film transistor switching element (TFT) follows. To form the gate electrode, chromium is vapor deposited over the substrate 21 and is delineated in a predetermined pattern. A silicon nitride film, gate insulating layer 26, of the gate electrode 25 is formed as an insulating layer. Hydrogen amorphous silicon (a-Si:H) as the semiconductor active layer 27 is deposited over the gate insulating layer 26 by the plasma CVD (Chemical Vapor Deposition) method. Succeedingly, a silicon nitride layer as the top insulating layer 29 is formed. The top insulating layer 29 is patterned. Then, n+ hydrogenated amorphous silicon (n+a-Si:H) as the ohmic contact layer 28 is deposited by the plasma CVD method. Then, it is etched to form the part 28a of the drain electrode and the part 28b of the source electrode. Aluminum is vapor deposited over those parts 28a and 28b of the ohmic contact layer, and is delineated so as to shape a wire 30a led from the photo detect element 11', a wire 30b connecting to the top insulating layer 29, and a portion covering the top insulating layer 29. In this manner, the thin film transistor switching element (TFT) is formed.

With such a structure of the thin film transistor switching elements (TFTs) in the image sensor, however, the part 28a of the drain electrode and the part 28b of the source electrode are possibly damaged when aluminum is vapor deposited directly on the n+ hydrogenated amorphous silicon (n+a - Si : H) layers as those parts 28a and 28b, or deposited thereon by the sputtering method. When those parts are damaged, the characteristic of the n+ hydrogenated amorphous silicon (n+a - Si : H) is deteriorated so that the performance of the TFT and the reliability of the image sensor are deteriorated.

Additionally, in manufacturing image sensors, the photo detect elements 11' and the TFTs are formed in different process steps. Accordingly, the manufacturing process is complicated.

SUMMARY OF THE INVENTION

For the above background reasons, an object of the present invention is to provide a method of manufacturing an image sensor, which is easy to manufacture and in which thin film transistor switching elements contained in the image sensor are highly reliable.

To solve the above problems, a method of manufacturing image sensors in which photo detect elements and thin film transistor switching elements are formed on a substrate is used. The method of the present invention comprises the steps of: forming a metal electrode as a gate electrode of each thin film transistor switching element on the substrate; forming a gate insulating layer covering the metal electrode; providing a semiconductor active layer on the gate insulating layer so as to correspond in location to the metal electrode; forming a semiconductor layer as an ohmic contact layer on the semiconductor active layer; dividing the semiconductor layer to form a part of a drain electrode and a part of a source electrode; covering the parts to be used as the drain electrode and the source electrode respectively with chromium layers as barrier metal; forming a lower electrode of the photo detect element when the chromium layer is formed; forming a photoconductive layer and an upper electrode of the photo detect element on the lower electrode; and forming a metal wiring layer connecting the upper electrode and the drain electrode part.

Additionally, in the method according to the present invention, tantalum layers can be applicable instead of the chromium layers.

According to the present invention, in the image sensor manufacturing method, the chromium layer or the tantalum layer as barrier metal is formed on the semiconductor layer as the ohmic contact layer of the thin film transistor switching element (TFT). With use of the chromium layer or the tantalum layer, the semiconductor layers of (n+a-Si:H) can be protected when metal, e.g., aluminum, is vapor deposited or deposited by the sputtering method. Accordingly, the characteristic of the semiconductor layers can be kept intact, and consequently the reliability of the image sensor is improved. Further, when the chromium layer or the tantalum layer as barrier metal is formed, the lower electrode portion of the photo detect element is formed using the same layer, in the same photolithograph process. Accordingly, the manufacturing of image sensors is simpler than when the photo detect elements and the TFTs are formed in different process steps.

The tantalum as barrier metal is more resistive to the galvanic corrosion than that of the chromium. In this respect, the image sensors having the tantalum layer as barrier metal are more reliable.

DETAILED DESCRIPTION OF THE PREFERRED EMBODIMENTS

Figure 1:
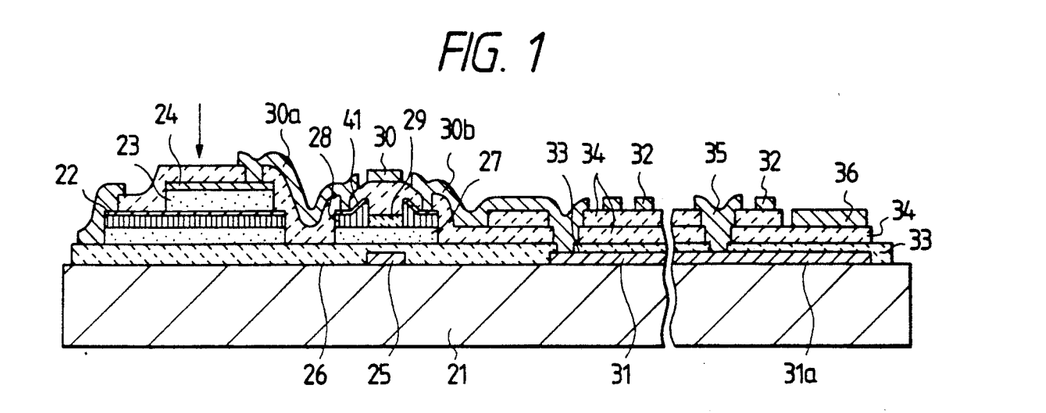
FIG. 1 is a sectional view showing an overall image sensor according to an embodiment of the present invention.
Figure 2A:
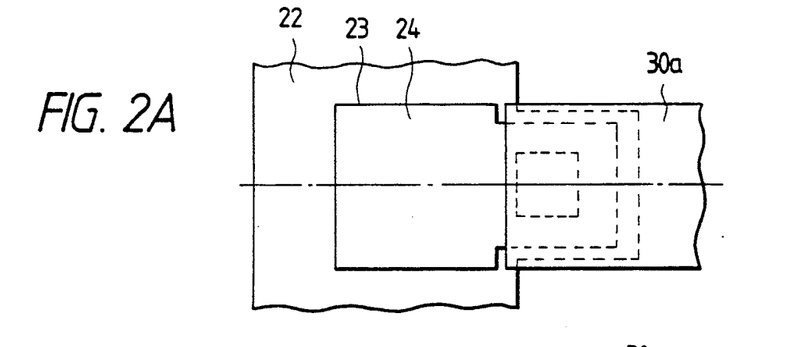
FIGS. 2A and 2B are a plan view and a sectional view showing a photo detect element (photo diode PD) in the instant embodiment.
Figure 2B:
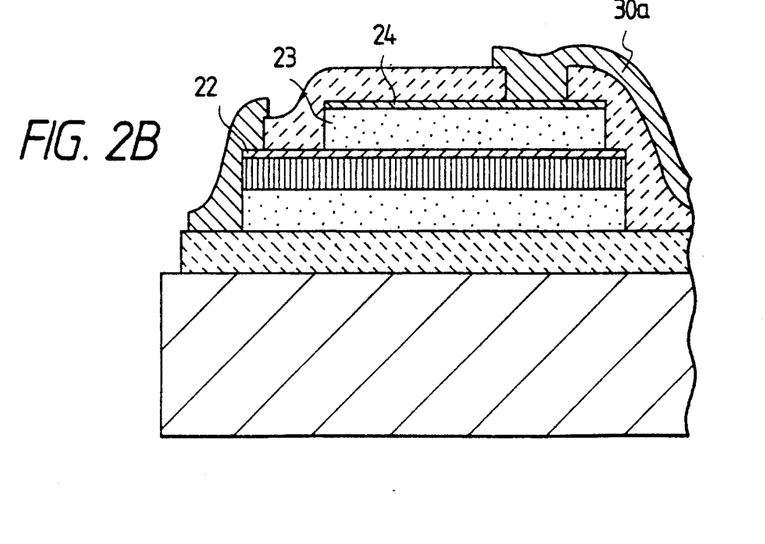
Figure 3A:
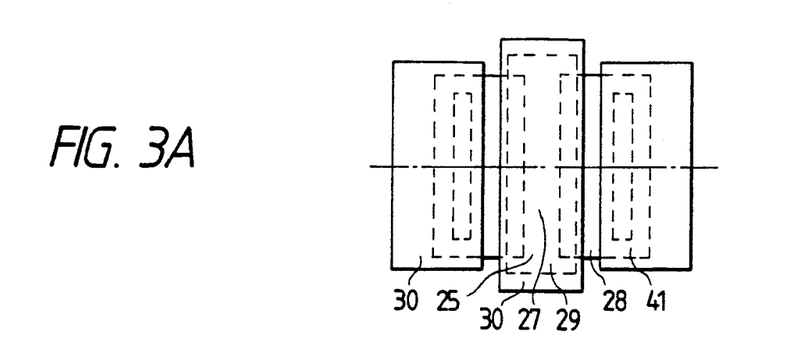
FIGS. 3A and 3B are a plan view and a sectional view showing a thin film transistor switching element (TFT) in the instant embodiment.
Figure 3B:
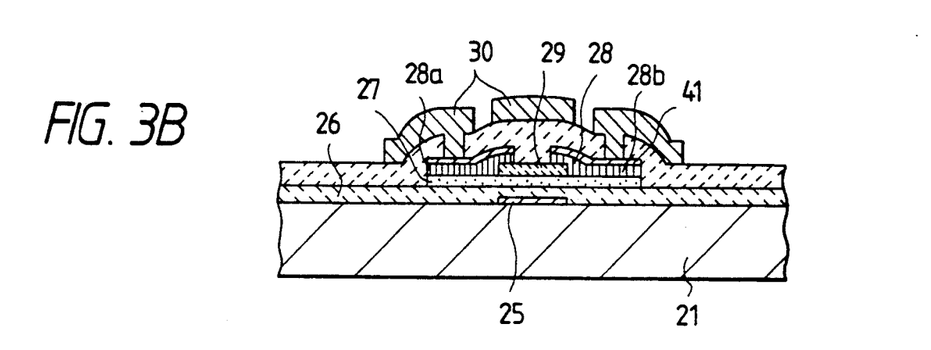
Figure 4A:
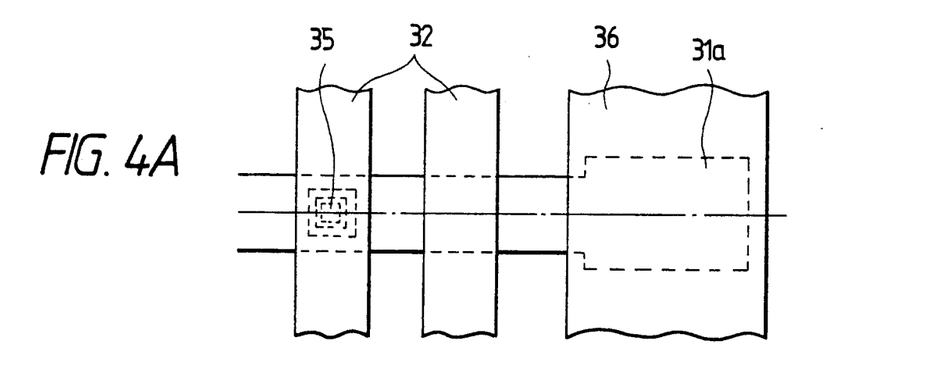
FIGS. 4A and 4B are a plan view and a sectional view showing multi-layer wires arrayed in a matrix and load capacitors in the instant embodiment.
Figure 4B:
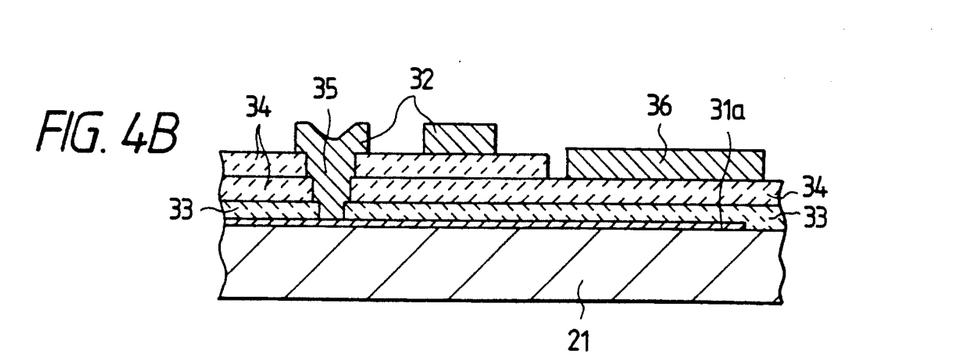

An embodiment of the present invention will be described with reference to the accompanying drawings. FIG. 1 is a sectional view showing an overall image sensor according to an embodiment of the present invention. FIGS. 2A and 2B are a plan view and a sectional view showing a photo detect element (photo diode PD) of the embodiment. FIGS. 3A and 3B are a plan view and a sectional view showing a thin film transistor switching element (TFT) of the embodiment. FIGS. 4A and 4B are a plan view and a sectional view showing multi-layer wires arrayed in a matrix and load capacitors of the embodiment. An equivalent circuit of the image sensor according to the embodiment is the same as that shown in FIG. 6. Throughout the drawings of those figures, like or equivalent portions are designated by like reference symbols.

An image sensor according to an embodiment of the invention comprises an array 11 ($PD_{1,1}$ to $PD_{N,n}$), which includes N blocks each containing "n" photo detect elements of the sandwich type 11', which are formed side by side on a substrate 21 made of insulating material, e.g., glass; a charge transfer section 12 including thin film transistors $T_{1,1}$ to $T_{N,n}$ respectively connected to the photo detect elements 11'; multi-layer wires 13 arrayed in a matrix, which includes an earth line E; "n" common lines 14 coupled with each block of the photo detect elements via the charge transfer section 12 and the multi-layer wires 13; analog switches $SW_1$ to $SW_n$ within a drive IC 15 coupled with the common signal lines 14; and load capacitors $C_1$ to $C_n$ coupled with the appropriate points along the common signal lines 14. The earth line E is provided for preventing cross talk among the wires.

The photo detect element 11' is of the sandwich structure, as shown in a sectional view in FIG. 2B. As shown, a belt-like metal electrode 22, which is made of chromium (Cr), for example, and to serve as a lower common electrode, a photoconductive layer 23 made of hydrogenated amorphous silicon (a—Si : H) divided for each photo detect element 11', and an upper transparent electrode 24, which is made of indium tin oxide (ITO) and is likewise divided, are successively layered on the substrate 21 made of glass, for example. The lower metal electrode 22 is shaped like a belt extending in the main scan direction. The photo conductive layers 23 are discretely formed on the metal electrode 22. The upper transparent electrodes 24 are likewise discretely formed to form individual electrodes. A portion of the structure where the photoconductive layer 23 is sandwiched by the metal electrode 22 and each transparent electrode 24, serves as each photo detect element 11'. Those portions are grouped into the photo detect element array 11. One end of each discrete transparent electrode 24 is connected to one end of a wire 30a made of, for example, aluminum. The other end of the wire 30a is connected to the drain electrode of the thin film transistor $T_{N,n}$ of the charge transfer section 12. In the photo detect element 11', the hydrogenated amorphous silicon of the photoconductive layer may be replaced by CdSe (cadmium selenium) or the like. If the photoconductive layer 23 of (a - Si : H) is made of a common layer, an interference inevitably occurs between the adjacent electrodes. To remove the interference, the photoconductive layers 23 and the transparent electrodes 24 are thus discretely formed.

The photoconductive layer 23 of the photo detect element 11' may be made of (a - Si : H. p - i -n), (a - SiC) or (a - SiGe). The photo detect element 11' may be a photo conductor or a photo transistor, although it is the photo diode in the instance as mentioned above.

As shown in FIG. 3, the structure of the thin film transistor $T_{N,n}$ of the charge transfer section 12 is of the inverse stagger type. As shown, a chromium layer as a gate electrode 25, silicon nitride film as a gate insulating layer 26, hydrogenated amorphous silicon (a - Si : H) layer as a semiconductor active layer 27, silicon nitride film as a top insulating layer 29, n+ hydrogenated amorphous silicon (n+a - Si : H) layer as an ohmic contact layer 28, chromium layer (Cr) as barrier metal 41, and an aluminum layer 30 as a wire are layered on the substrate 21 successively from bottom to top. The divided portions of the ohmic contact layer 28 and the barrier metal 41 form a drain electrode portion and a source electrode portion, respectively. To the drain electrode is connected a wire 30a led from the transparent electrode 24 of the photo detect element. The ohmic contact layer 28 is divided into a layer 28a to form the drain electrode, and a layer 28b to form the source electrode. The chromium (Cr) layer as the barrier metal 41 covers the ohmic contact layers 28a and 28b.

Another material, such as polycrystalline silicon, may be used to make the semiconductor layer 27. Also in this case, the useful effects comparable with the previous case can be obtained.

A structural arrangement of the matrix multi-layer wires 13 and the load capacitors $C_n$ will be described with reference to FIG. 4.

In the multi-layer wires 13, lower longitudinal wires 31 are chromium layers, and upper lateral wires 32 are aluminum layers. First insulating layers 33 made of silicon nitride and second insulating layers 34 made of polyimide are disposed between the longitudinal wires 31 and the lateral wires 32, and those wires are arrayed in a matrix fashion. The second insulating layer also includes two layers. The multi-layer structure is employed for the insulating layer in order to reduce the cross talk at the intersections of the matrix wires. The upper and lower wires are interconnected at each contact hole 35.

The load capacitor $C_n$ is formed as follows. Each electrode to serve as the lower electrode 31a of the load capacitor, which is made of chromium, is located at the distal end of each longitudinal wire 31 of the multi-layer wires 13, and is formed with the longitudinal wire. Silicon nitride of the first insulating layer 33 and polyimide of the second insulating layer 34 of the multi-layer wirings 13 are extended and layered over the electrode, thereby to form an insulating layer. In this case, the insulating layer 34 is a single layer. The belt-like upper electrode 36 portions of the load capacitors Cl to Cn, are formed on the insulating layer 34 in the same step as of forming the upper horizontal wires 32 of the multi-layer wires 13.

The lower wires 31 and the individual lower electrodes 31a of the load capacitors are formed in the same photolithograph process. The upper wires 32 and the upper common electrodes 36 of the load capacitors are also formed in the same photolithograph process. The structure of the multi-layer wires 13 and the load capacitors 14 is covered with a protecting film.

The "n" common signal lines 14 consist of parts of the lateral wires 32 of the multi-layer wire 13. The load capacitors $C_1$ to $C_n$ are coupled with appropriate points along the common signal lines 14. Those signal lines are connected to analog switches $SW_1$ to $SW_n$ within the drive IC 15. Potentials of the common signal lines 14 vary depending on the charges stored in the load capacitors $C_1$ to $C_n$. The potential values are picked up onto an output line 16 (FIG. 6) through the operations of the analog switches $SW_n$ within a drive IC 15.

Figure 5:
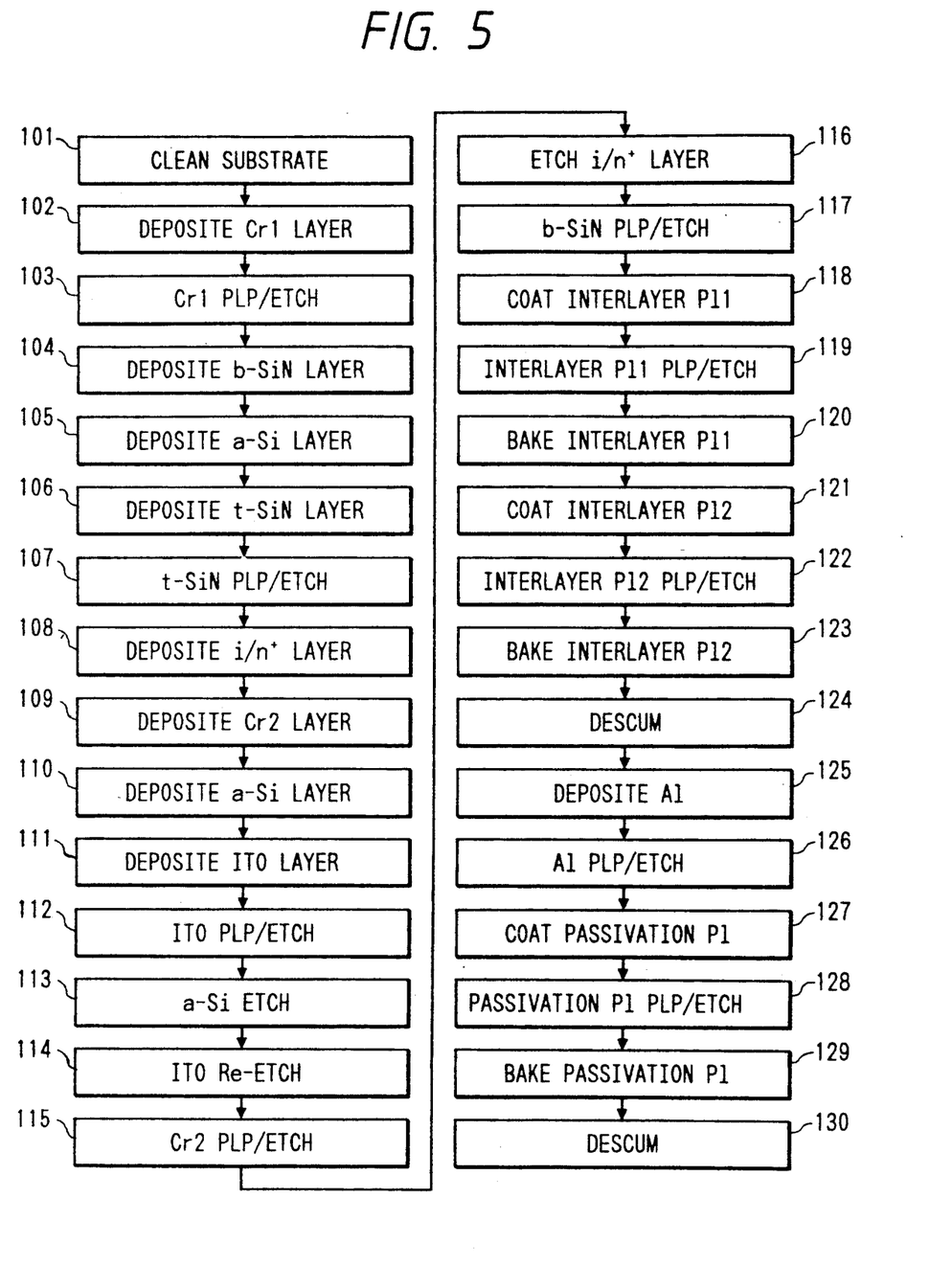
FIG. 5 is a flow chart explaining a method of manufacturing image sensors according to an embodiment of the present invention.

A method of manufacturing image sensors according to an embodiment of the present invention will be described with reference to FIG. 5 showing a flow chart.

First, the substrate 21 of glass, for example, is inspected and cleaned (101). Chromium is deposited up to approximately 750 angstroms on the substrate 21 by the DC sputtering method, thereby to form a first chromium layer Crl to be used as the gate electrodes 25 and the lower wires 31 of the multi-layer wires 13 (102). Then, this chromium Crl is layer patterned by photolithograph process (PLP) and etching process (Etch) (103). Then, the structure is subjected to BHF process and alkaline cleaning. To form the insulating layer 26 of the thin film transistor switching elements (TFTs), the semiconductor active layer 27 to be layered thereon, and the insulating layer 29 to be layered over the layer 27 on a Crl pattern, SiNx, (a-Si:H), and SiNx are consecutively deposited up to approximately 3000, 500, and 1500 angstroms, respectively, by the plasma CVD (P-CVD) method, while keeping the vacuum state (104 to 106). The lower gate insulating layer 26 in the TFT will be called bottom-SiNx (b-SiNx), and the top insulating layer 29, top-SiNx (t-SiNx). Since the layers are consecutively formed under the vacuum state, the layer interfaces can be protected from contamination, to improve S/N ratio.

The conditions required for forming the b-SiNx film by the P-CVD method are: substrate temperature is 300° to 400° C., gas pressure of SiH4 and NH3 is 0.1 to 0.5 Torr, gas flow rate of SiH4 is 10 to 50 sccm, gas flow rate of NH3 is 100 to 300 sccm, and RF power is 50 to 200 W.

The conditions required for forming the a-Si:H film by the P-CVD method are: substrate temperature is 200° to 300° C., gas pressure of SiH4 is 0.1 to 0.5 Torr, gas flow rate of SiH4 is 100 to 300 sccm, and RF power is 50 to 200 W.

The conditions required for forming the t-SiNx film by the P-CVD method are: substrate temperature is 200° to 300° C., gas pressure of SiH4 and NH3 is 0.1 to 0.5 Torr, gas flow rate of SiH4 is 10 to 50 sccm, gas flow rate of NH3 is 100 to 300 sccm, and RF power is 50 to 200 W.

Then, top insulating layer 29 is configured so as to have a pattern corresponding to that of the gate electrode 25 (107).

The structure is subjected to BHF processing, and n+ type a-Si:H is deposited up to approximately 1000 angstroms by the P-CVD method, thereby to form the ohmic contact layer 28 (108). Succeedingly, chromium is deposited up to about 1500 angstroms by the DC magnetron sputtering method, to form a second chromium layer Cr2 to be used as the barrier metal 41 of the drain and source electrodes of the TFT, and the metal electrode 22 in the lower portion of the photo detect element 11'(109). a-Si:H is deposited to be a thickness of 13000 angstroms by the P-CVD method, to form the photoconductive layer 23 of the photo detect element 11' (110). Further, ITO is deposited to be thickness of about 600 angstroms by the DC magnetron sputtering method, thereby to form the transparent electrode 24 of the photo detect element 11' (111). As a matter of course, the structure is alkali washed before each film formation.

Afterwards, to form the individual transparent electrodes 24 of the elements 11', the ITO layer is patterned by photolithograph process and etching process (112). By using the same resist pattern, the a-Si:H layer of the photoconductive layer 23 is patterned by dry etching process (113). The chromium layer Cr2 of the metal electrode 22 serves as a stopper at the time of dry etching the a-Si:H, and is left intact after the patterning. At the time of dry etching the a-Si:H, great side edges are formed in the a-Si:H layer of the photoconductive layer 23. Accordingly, before the register is removed, the ITO is again etched (114). With the etching, the ITO is further etched from its peripheral rear side, so that the ITO whose size is equal to that of the a-Si:H layer of the photoconductive layer 23.

The conditions required for forming the a-SiNx film by the P-CVD method are: substrate temperature is 170° to 250° C., gas pressure of SiH4 is 0.3 to 0.7 Torr, gas flow rate of SiH4 is 150 to 300 sccm, and RF power is 100 to 200 W.

The conditions required for forming the ITO film by the DC sputtering method are: substrate temperature is room temperature, gas pressure of Ar and $O_2$ is $1.5 \times 10^{-3}$ Torr, gas flow rate of Ar is 100 to 150 sccm, gas flow rate of $O_2$ is 1 to 2 sccm, and RF power is 200 to 400 W.

The chromium layer Cr2 to serve as the Cr layer of the metal electrode 22 of the photo detect element 11' and the Cr layer of the barrier metal 41 is patterned by photolitho process and etching process (115). With the same resist pattern, the n+ a-Si:H layer to serve as the lower layer of the Cr layer of the metal electrode 22 of the photo detect element 11' and the n+ a-Si:H layer of the ohmic contact layer 28 of the TFT are etched (116).

The b-SiNx is delineated by photolitho etching process, in order to form patterns of the gate insulating layer 26 of the TFT and the first interlayer insulating layer 33 of the multi-layer wires 13 (117). The image sensor is entirely coated with an insulating layer of polyimide (P11) about 11500 angstroms thick (118). Then, the structure is pre-baked and subjected to photolitho etching process (119), and is baked again (120). The polyimide (P12) of the second insulating layer is likewise subjected to a coating of 11500 angstroms thick, baking, photolitho etching, and baking (121 to 123). Through the process steps thus far mentioned, the contact portion to feed power source to the metal electrode 22 and the portion to pick up charge from the transparent electrode 24 are formed in the photo detect element 11'. In the TFT, the contact portion coupled with the wires by which charges generated by the photo detect elements 11' are transferred, and the contact portion as an outlet from which charges are led to the multi-layer wires 13 are formed. Further, in the multi-layer wires 13, the contact hole 35 for connecting the upper and lower wires is formed. Thereafter, to completely remove the polyimide left in the hole 35, for example, Descum is conducted where the structure is placed in plasma of $O_2$ (124).

Next, by the DC magnetron sputtering method, aluminum (Al) is deposited up to 15000 angstroms (125) thick, to cover the whole image sensor, and then the aluminum film thus formed is delineated by photolitho etching process, to have a desired pattern (126). As a result, in the photo detect element 11', charge is derived from the wire portion to supply power source and the transparent electrode 24, and those portions are formed; the wire 30a portion connecting to a part 28a of the train electrode of the TFT, the wire 30b portion for leading charge from the part of 28b of the source electrode of the TFT to the multi-layer wires 13. Further, the upper wires 32 of the multi-layer wires 13 and the upper common electrode 36 of the load capacitors are formed.

Following this, coating of polyimide as a passivation layer (not shown) (127), pre-baking and patterning by photolitho etching process (128), and additional baking process to form a passivation layer (129) are carried out in this order. Finally, the structure is subjected to Descum process, to remove the unnecessary remaining polyimide.

A drive IC 15 is mounted to the image sensor chip thus fabricated, and wire bonding and assembling are applied to them, to complete an image sensor.

The following is a description of how to drive the image sensor of an embodiment according to the present invention.

An original (not shown) put on the photo detect array 11 is irradiated with light rays emitted from a light source (not shown). Photo detect elements (photo diodes PD) receive the light reflected from the original, each of the photo detect elements generate charges amounting to an optical density on the original. The charges are temporally stored in the parasitic capacitor of the photo detect elements 11'. In response to a gate pulse $\phi G$ as generated from a gate pulse generator (not shown), the thin film transistor T is turned on. When it is turned on, it connects the photo diode PD to the common signal line 14, and allows charges stored in parasitic capacitance to be transferred to the load capacitor and to be stored therein. When charges are generated at the photo diodes $PD_{1,1}$ to $PD_{1,n}$ in the first block, in this case, when a gate pulse $\phi G1$ is applied from the gate pulse generator, the thin film transistors $T_{1,1}$ to $T_{1,n}$ are turned on. Under this condition, the charges generated at the photo diodes $PD_{1,1}$ to $PD_{1,n}$ are transferred to and stored in the load capacitors $C_1$ to $C_n$ through the matrix multi-layer wires 13. Afterwards, the transistors $T_{1,1}$ to $T_{1,n}$ are turned off.

The timing generator (not shown) sequentially generates read switching signals $\phi S_1$ to $\phi S_n$ for transmission to the read switches $SW_1$ to $SW_n$ in the drive IC 15. At the same time, the timing generator sequentially applies reset switching signals $\phi R_1$ to $\phi R_n$ to the reset switching elements $RS_1$ to $RS_n$ of the drive IC 15. The reset switching signals are delayed one timing behind the read switching signals, respectively. Consequently, the charges stored in the load capacitors $C_1$ to $C_n$ are output (T out) in the form of image signals. Then, charges generated by the photo diodes PDs of the next block are transferred.

As seen from the foregoing description, in the image sensor, the chromium layer as the barrier metal 14 is layered over the semiconductor layer of (n+ a-Si:H) to serve as the part 28b of the source electrode and the part 28a of the drain electrode that are the ohmic contact layer of the thin transistor switching element. Use of the chromium layer can successfully prevent those parts from being damaged at the time of vapor deposition of aluminum or the deposition of the same by the sputtering method to form the wiring layer 30. Accordingly, the characteristic of the (n+a-Si:H) of the ohmic contact layer 28 can be kept intact, and consequently the reliability of the image sensor can be improved. Further, a chromium layer is formed in the same photolitho process, and the chromium layer formed is used for the barrier metal 41 and the metal electrode 22 serving as the common electrode in the lower portion of the photo detect element 11'. This method more simplifies the process to fabricate the image sensor, when comparing with that to use two different steps to fabricate the photo detect element 11' and the TFT.

Alternatively, a tantalum (Ta) layer in place of the chromium layer may be used for the barrier metal 41 of the thin film transistor (TFT) and the metal electrode 22 of the photo detect element 11'. When using the chromium (Cr) layer, the TFT is protected by the protecting film, but the surfaces of the Cr layer are electrolytically corroded. Specifically, moisture penetrates through a path between the Cr layers, and oxidizes the surfaces of the Cr layers due to electrolysis occurring thereat. Oxidized material on the Cr surfaces is dissolved into water. Since tantalum Ta is resistive to the electrolytic corrosion, however, the image sensor using Ta is free from the electrolytic corrosion problem.

To form the Ta layer, two requirements for the Ta used must be met, because the photo detect elements and the TFTs are simultaneously formed as mentioned above. One of the requirements is that in patterning the Ta layer, etching stops at the semiconductor layer 27 of (n+a-Si:H) as the lower layer. The other is that in patterning the photoconductive layer 23 of (a-Si:H) of the photo detect element, etching stops at the Ta layer of its lower layer. Accordingly, a select ratio of Ta to (n+a-Si:H) when the Ta layer is etched, and a select ratio of (a-Si:H) to Ta when the (a-Si:H) layer is etched must be secured.

Specific cases of the patterning will be described. It is assumed that in patterning the tantalum layer in the TFT, dry etching process using chlorine gas (CCl4, etc.) is used. In this case, an etching select ratio of Ta to (n+a-Si:H) of the semiconductor layer 27 as its underlayer is Ta : (n+a-Si:H) =4 : 1. This facts indicates that when Ta is etched at the rate of 4, etching of (n+a-Si:H) progresses at the rate of 1. Accordingly, the etching of Ta stops at the semiconductor layer 27 of (n+a-Si:H).

It is assumed that in patterning the photoconductive layer 23 of (a-Si:H) of the photo detect element, dry etching process using fluorine gas (CF4, etc.) is used. In this case, an etching select ratio of (a-Si:H) to Ta of the metal electrode 22 as its underlayer is (a-Si:H) : Ta=11 : 1. This fact indicates that when (a-Si:H) is etched at the rate of 11, etching of Ta progresses at the rate of 1. Accordingly, the etching of (a-Si:H) stops at Ta of the metal electrode 22.

In the dry etching of the TFT, a select ratio of Ta to the top insulating layer 29 and the select ratio of Ta to (n+a-Si:H) as well must be taken into consideration. Otherwise, the top insulating layer 29 would be etched, and extremely the semiconductor layer 27 of (a-Si:H) of channel would be opened.

According to another embodiment as mentioned above, in the image sensor, the tantalum (Ta) layer as the barrier metal 14 is layered over the semiconductor layer of (n+a-Si:H) to serve as the part 28b of the source electrode and the part 28a of the drain electrode that are the ohmic contact layer of the thin transistor switching element. Use of the tantalum layer can successfully prevent those parts from being damaged at the time of vapor deposition of aluminum or the deposition of the same by the sputtering method to form the wiring layer 30. Accordingly, the characteristic of the (n+a-Si:H) of the ohmic contact layer 28 can be kept intact, and consequently the reliability of the image sensor can be improved. Further, a tantalum layer is formed in the same photolitho process, and the tantalum layer formed is used for the barrier metal 41 and the metal electrode 22 serving as the common electrode in the lower portion of the photo detect element 11'. This method more simplifies the process to fabricate the image sensor, when comparing with that to use two different steps to fabricate the photo detect element 11' and the TFT.

According to the present invention, in the image sensor manufacturing method, the chromium layer as barrier metal is formed on the semiconductor layer as the ohmic contact layer of the thin film transistor switching element (TFT). With use of the chromium layer, the semiconductor layers of (n+a-Si:H) can be protected when metal, e.g., aluminum, is vapor deposited or deposited by the sputtering method. Accordingly, the characteristic of the semiconductor layers can be kept intact, and consequently the reliability of the image sensor is improved. Further, when the chromium layer is formed, the lower electrode portion of the photo detect element is formed using the same chromium layer, in the same photolitho process. Accordingly, the manufacturing of image sensors is simpler than that of the same in which the photo detect elements and the TFTs are formed in different process steps.

Further, in the method according to the present invention, tantalum layers can be applicable instead of the chromium layers. That is, in the image sensor manufacturing method, the tantalum layer as barrier metal is formed on the semiconductor layer as the ohmic contact layer of the thin film transistor switching element (TFT). With use of the tantalum layer, the semiconductor layers of (n+a-Si:H) can be protected when metal, e.g., aluminum, is vapor deposited or deposited by the sputtering method. Accordingly, the characteristic of the semiconductor layers can be kept intact, and consequently the reliability of the image sensor is improved. Further, when the tantalum layer is formed, the lower electrode portion of the photo detect element is formed using the same tantalum layer, in the same photolitho process. Accordingly, the manufacturing of image sensors is simpler than that of the same in which the photo detect elements and the TFTs are formed in different process steps. Further, the tantalum as barrier metal is more resistive to the galvanic corrosion than the chromium as barrier metal. In this respect, the image sensors using the tantalum layer is more reliable.

What is claimed is:

1. A method of manufacturing image sensors in which photo detect elements and thin film transistor switching elements are formed on a substrate, the method comprising the steps of:

forming a metal electrode as a gate electrode of each said thin film transistor switching element on said substrate;

forming a gate insulating layer covering said metal electrode;
providing a semiconductor active layer on said gate insulating layer so as to correspond in location to said metal electrode;
forming a semiconductor layer as an ohmic contact layer on said semiconductor active layer;
dividing said semiconductor layer to form a part of a drain electrode and a part of a source electrode;
covering said parts to e used as said drain electrode and said source electrode respectively with chromium layers as barrier metal;
forming a lower electrode for the photo detect elements from said chromium layer simultaneously with the formation of said barrier metal;
forming a photoconductive layer and an upper electrode of said photo detect element on said lower electrode;
forming an insulating layer on said upper electrode;
forming contact holes on said insulating layer at said upper electrode and said drain electrode; and
forming a metal wiring layer connecting said upper electrode and said drain electrode part through said contact holes.

2. A method of manufacturing image sensors in which photo detect elements and thin film transistor switching elements are formed on a substrate, the method comprising the steps of:
forming a metal electrode as a gate electrode of each said thin film transistor switching element on said substrate;
forming a gate insulating layer covering said metal electrode;
providing a semiconductor active layer on said gate insulating layer so as to correspond in location to said metal electrode;
forming a semiconductor layer as an ohmic contact layer on said semiconductor active layer;
dividing said semiconductor layer to form a part of a drain electrode and a part of a source electrode;
covering said parts to be used as said drain electrode and said source electrode respectively with tantalum layers as barrier metal;
forming a lower electrode of each said photo detect element from said tantalum layer simultaneously with the formation of said barrier metal;
forming a photoconductive layer and an upper electrode of said photo detect element on said lower electrode;
forming an insulating layer on said upper electrode;
forming contact holes on said insulating layer at said upper electrode and said drain electrode; and
forming a metal wiring layer connecting said upper electrode and said drain electrode part through said contact holes.

3. The method according to claim 1, wherein a plurality of said photo detect elements and thin film transistor elements are provided, the step of forming the upper electrodes of the photo detect elements comprises forming them individually and the step of forming the metal wiring layer comprises connecting the upper electrodes of the photo detect elements and the barrier metal of the thin film transistor switching elements in one-to-one correspondence.

4. The method according to claim 2, wherein a plurality of said photo detect elements and thin film transistor elements are provided, the step of forming the upper electrodes of the photo detect elements comprises forming them individually, and the step of forming the metal wiring layer comprises connecting the upper electrodes of the photo detect elements and the barrier metal of the thin film transistor switching elements in one-to-one correspondence.

* * * * *